United States Patent
van Zyl

(10) Patent No.: US 8,004,251 B2
(45) Date of Patent: Aug. 23, 2011

(54) METHOD AND APPARATUS FOR MODIFYING INTERACTIONS BETWEEN AN ELECTRICAL GENERATOR AND A NONLINEAR LOAD

(75) Inventor: Gideon van Zyl, Fort Collins, CO (US)

(73) Assignee: Advances Energy Industries, Inc., Fort Collins, CO (US)

( * ) Notice: Subject to any disclaimer, the term of this patent is extended or adjusted under 35 U.S.C. 154(b) by 0 days.

(21) Appl. No.: 12/494,026

(22) Filed: Jun. 29, 2009

(65) Prior Publication Data

US 2009/0278598 A1   Nov. 12, 2009

Related U.S. Application Data

(63) Continuation of application No. 11/740,710, filed on Apr. 26, 2007, now Pat. No. 7,570,028.

(51) Int. Cl.
*H02P 9/30* (2006.01)
(52) U.S. Cl. ............................................ 322/36; 322/37
(58) Field of Classification Search .................... 322/21, 322/22, 23, 25, 36, 37, 99, 28
See application file for complete search history.

(56) References Cited

U.S. PATENT DOCUMENTS

| | | |
|---|---|---|
| 4,160,397 A | 7/1979 | Bertini |
| 4,387,777 A | 6/1983 | Ash |
| 4,462,942 A | 7/1984 | Hamill et al. |
| 4,463,306 A | 7/1984 | de Mello et al. |
| 4,478,130 A | 10/1984 | Brenner et al. |
| 4,496,899 A | 1/1985 | Lippitt et al. |
| 4,614,060 A | 9/1986 | Dumenil et al. |
| 4,704,443 A | 11/1987 | Lamont |
| 4,716,441 A | 12/1987 | Ogawa |
| 4,770,097 A | 9/1988 | Wilson et al. |
| 4,779,924 A | 10/1988 | Rudel |
| 5,483,147 A * | 1/1996 | Ilic et al. .......................... 322/25 |
| 5,576,629 A | 11/1996 | Turner et al. |
| 5,672,949 A | 9/1997 | Ward |
| 5,710,492 A * | 1/1998 | Konishi et al. ................. 318/156 |
| 5,747,935 A | 5/1998 | Porter et al. |
| 5,817,093 A | 10/1998 | Williamson, IV et al. |
| 5,827,435 A | 10/1998 | Samukawa |
| 5,859,501 A | 1/1999 | Chi |
| 5,977,737 A * | 11/1999 | Labriola, II ..................... 318/599 |

(Continued)

OTHER PUBLICATIONS

Young, Lee W., "PCT International Search Report re Application No. PCT/US08/61232", Sep. 10, 2008, Published in: PCT.

*Primary Examiner* — Nicholas Ponomarenko
(74) *Attorney, Agent, or Firm* — Neugeboren O'Dowd PC; Sean R. O'Dowd

(57) ABSTRACT

A method and apparatus for modifying interactions between an electrical generator and a nonlinear load is described. One illustrative embodiment receives a main control signal at a control input of an engine of the electrical generator, the main control signal controlling at least one of output power, output current, and output voltage delivered by the electrical generator to the nonlinear load, the engine being one of a power amplifier and a converter; measures the impedance of the nonlinear load; and feeds to the electrical generator a compensation signal corresponding to the measured impedance, the compensation signal rendering a transfer function of the output power of the electrical generator with respect to the main control signal substantially insensitive to variations in the impedance of the nonlinear load to stabilize the output power of the electrical generator.

17 Claims, 11 Drawing Sheets

U.S. PATENT DOCUMENTS

| | | | |
|---|---|---|---|
| 5,985,375 A | 11/1999 | Donohoe et al. | |
| 6,009,828 A | 1/2000 | Tomita et al. | |
| 6,030,667 A | 2/2000 | Nakagawa et al. | |
| 6,045,877 A | 4/2000 | Gleason et al. | |
| 6,046,546 A | 4/2000 | Porter et al. | |
| 6,054,063 A | 4/2000 | Ohtake et al. | |
| 6,187,685 B1 | 2/2001 | Hopkins et al. | |
| 6,214,162 B1 | 4/2001 | Koshimizu | |
| 6,218,196 B1 | 4/2001 | Ise et al. | |
| 6,312,556 B1 | 11/2001 | Donohoe et al. | |
| 6,372,654 B1 | 4/2002 | Tokashiki | |
| 6,391,659 B1 | 5/2002 | Kwon et al. | |
| 6,416,822 B1 | 7/2002 | Chiang et al. | |
| 6,426,302 B2 | 7/2002 | Kitagawa | |
| 6,432,834 B1 | 8/2002 | Kim | |
| 6,459,066 B1 | 10/2002 | Khater et al. | |
| 6,459,067 B1 | 10/2002 | Vona, Jr. et al. | |
| 6,696,820 B2 | 2/2004 | Peter | |
| 7,570,028 B2 * | 8/2009 | van Zyl | 322/36 |

* cited by examiner

METHOD AND APPARATUS FOR MODIFYING INTERACTIONS BETWEEN AN ELECTRICAL GENERATOR AND A NONLINEAR LOAD

PRIORITY

This application is a continuation of U.S. application Ser. No. 11/740,710, entitled: METHOD AND APPARATUS FOR MODIFYING INTERACTIONS BETWEEN AN ELECTRICAL GENERATOR AND A NONLINEAR LOAD, filed Apr. 26, 2007 now U.S. Pat. No. 7,570,028, which is incorporated herein by reference.

FIELD OF THE INVENTION

The present invention relates generally to electrical generators. In particular, but not by way of limitation, the present invention relates to methods and apparatuses for modifying interactions between an electrical generator and a nonlinear load.

BACKGROUND OF THE INVENTION

In some applications, it is advantageous to use an electrical generator with a source impedance that is very different from the source impedance that would result in maximum power delivery to the load. For example, in the context of radio-frequency (RF) generators, the source impedance is often very different from the complex conjugate of the load impedance. In terms of a Smith chart (reflection coefficient chart, Philip H. Smith, 1939), the source impedance in such generators is toward the edge of a chart normalized to the load impedance (e.g., 50 ohms for standard RF applications). Some radio-frequency (RF) generators are designed with such a source impedance to render the generator less expensive and bulky than one having a resistive source impedance (e.g., 50 ohms).

One disadvantage of such a design, however, is that the generator is much more sensitive to variations in load impedance when the load impedance is close to the nominal load impedance (e.g., 50 ohms) into which the generator is designed to operate than a generator having a resistive source impedance that is matched to the load impedance. A particular difficulty in such systems when operated into a nonlinear load such as a plasma is that a change in generator output power can result in a change in load impedance, and a change in load impedance can result in a change in generator output power. In some situations, the generator and the nonlinear load may interact in a manner that results in instability of the output power.

It is thus apparent that there is a need in the art for an improved method and apparatus for modifying interactions between an electrical generator and a nonlinear load.

SUMMARY OF THE INVENTION

Illustrative embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents, and alternative constructions that fall within the spirit and scope of the invention as expressed in the claims.

The present invention can provide a method and apparatus for modifying interactions between an electrical generator and a nonlinear load. One illustrative embodiment is a method for modifying interactions between an electrical generator and a nonlinear load connected with an output of the electrical generator, the method comprising receiving a main control signal at a control input of an engine of the electrical generator, the main control signal controlling at least one of output power, output current, and output voltage delivered by the electrical generator to the nonlinear load, the engine being one of a power amplifier and a converter; measuring the impedance of the nonlinear load; and feeding to the electrical generator a compensation signal corresponding to the measured impedance, the compensation signal rendering a transfer function of the output power of the electrical generator with respect to the main control signal substantially insensitive to variations in the impedance of the nonlinear load to stabilize the output power of the electrical generator.

Another illustrative embodiment is an electrical generator, comprising an engine including a control input configured to receive a main control signal, the main control signal controlling at least one of output power, output current, and output voltage delivered by the electrical generator to a nonlinear load connected with an output of the electrical generator, the engine being one of a power amplifier and a converter; and a compensation subsystem including an impedance-measurement circuit that measures the impedance of the nonlinear load and a compensation-signal-generation circuit that feeds to the electrical generator a compensation signal corresponding to the measured impedance, the compensation signal rendering a transfer function of the output power of the electrical generator with respect to the main control signal substantially insensitive to variations in the impedance of the nonlinear load to stabilize the output power of the electrical generator.

These and other embodiments are described in further detail herein.

BRIEF DESCRIPTION OF THE DRAWINGS

Various objects and advantages and a more complete understanding of the present invention are apparent and more readily appreciated by reference to the following Detailed Description and to the appended claims when taken in conjunction with the accompanying Drawings, wherein:

DETAILED DESCRIPTION

Figure 1A:
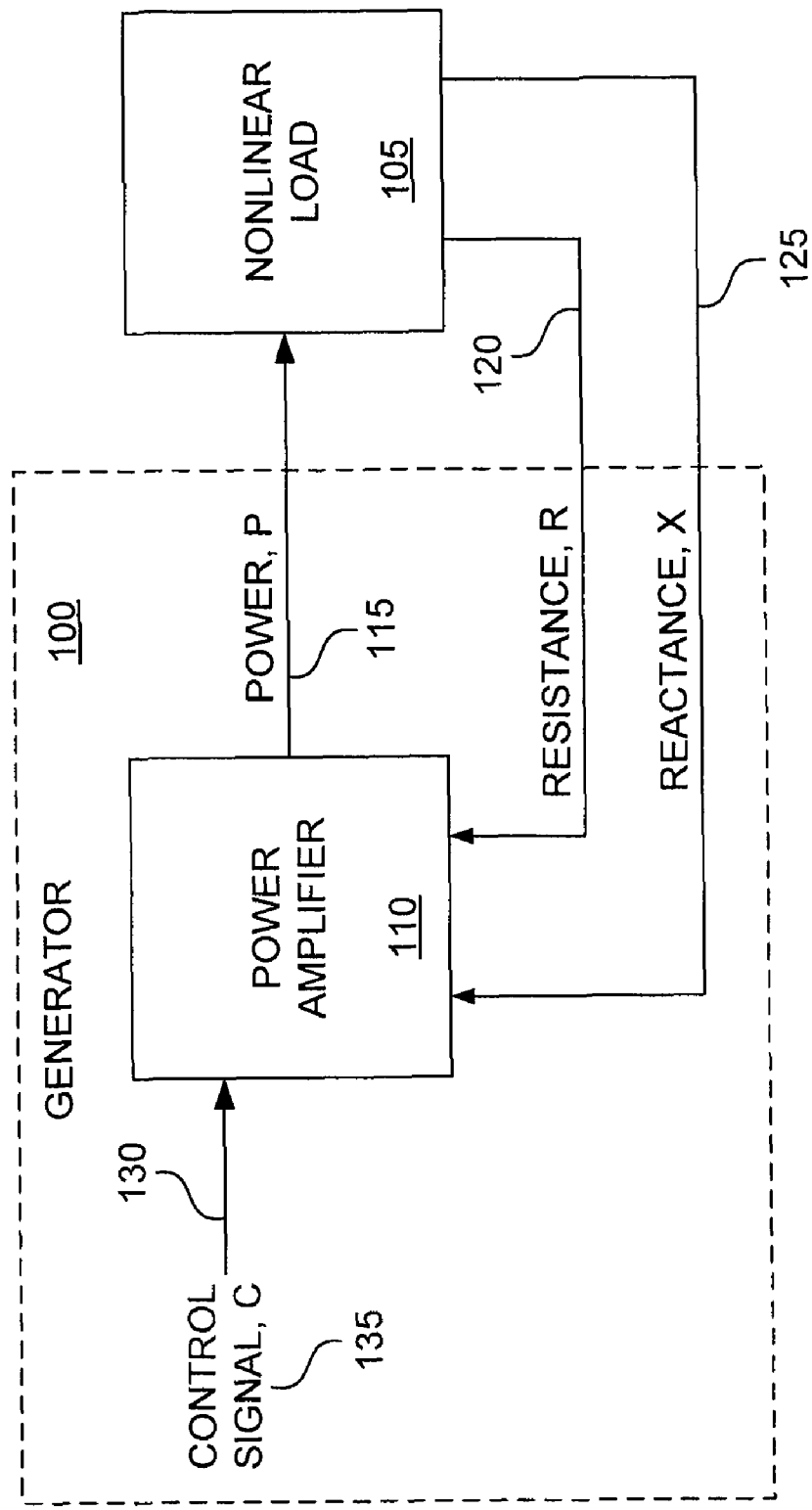
FIG. 1A is a block diagram of a generator connected with a nonlinear load to facilitate an analysis of the stability of the generator.

An understanding of various embodiments of the invention is aided by an analysis of how instability in the output power of an electrical generator can occur as a result of interactions between the generator and the impedance of a nonlinear load with which it is connected. FIG. 1A is a block diagram of a generator 100 connected with a nonlinear load 105 to facilitate such an analysis. Generator 100 includes a power amplifier 110, which delivers output power P 115 to the nonlinear load 105. Nonlinear load 105 in turn presents an impedance Z to power amplifier 110, the real and imaginary components of which are, respectively, resistance R 120 and reactance X 125. That is, Z=R+jX.

Power amplifier 110 includes a control input 130 that receives a control signal C 135. Control signal 135 is used to control the output power 115 produced by power amplifier 110. Control signal 135 is produced by a main power control loop (not shown in FIG. 1A).

Assuming that changes in generator output power 115 in response to a change in impedance of the nonlinear load 105 occur instantaneously and, similarly, that changes in the impedance of nonlinear load 105 occur instantaneously when the output power 115 into nonlinear load 105 is changed, the system shown in FIG. 1A can be modeled by the following three equations:

$$P = f(C,R,X)$$

$$R = g(P)$$

$$X = h(P).$$

Assuming these functions are differentiable and using a Taylor series expansion with only the first derivative they can be linearized around the operating point to obtain $$\frac{dP}{dC} = \frac{1}{1 - \frac{\partial f}{\partial R}\frac{dg}{dP} - \frac{\partial f}{\partial X}\frac{dh}{dP}} \frac{\partial f}{\partial C}$$ (Equation 1)

$$= \frac{1}{1 - \left(\frac{dP}{dZ}, \frac{dZ}{dP}\right)} \frac{\partial f}{\partial C},$$

where $$\left(\frac{dP}{dZ}, \frac{dZ}{dP}\right)$$

is the inner product of the vectors $$\frac{dP}{dZ} = \left(\frac{\partial f}{\partial R}, \frac{\partial f}{\partial X}\right)$$

and $$\frac{dZ}{dP} = \left(\frac{dg}{dP}, \frac{dh}{dP}\right).$$

The first of these vectors models the sensitivity of the generator 100 to changes in the impedance of nonlinear load 105, and the second vector models the sensitivity of the impedance of nonlinear load 105 to changes in generator power 115.

As long as the above inner product is less than 1, a drop in the gain of the main power control loop of generator 100 can compensate for the increase in gain of the output power 115 with respect to the control signal 135. However, when the above inner product is greater than 1, the sign of the transfer function from the control signal 135 to the output power 115 is reversed, and no modification of the gain of the generator's main power control loop can restore stability. In an unstable condition, generator 100 does not produce a constant output power 115 as desired.

Figure 1B:
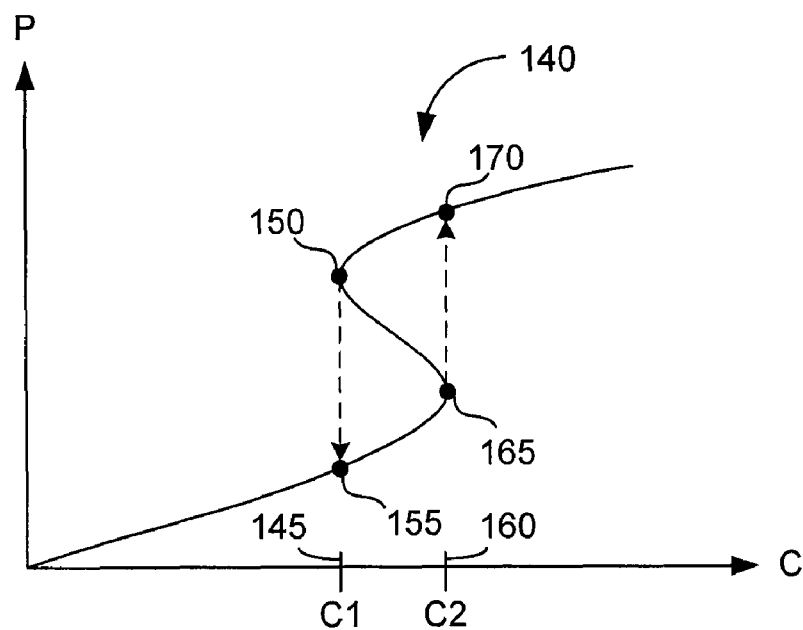
FIG. 1B is a graph of the output power P of the generator shown in FIG. 1A as a function of generator control signal C in a situation in which P is unstable.

The instability that can result due to interactions between generator 100 and nonlinear load 105 is illustrated in FIG. 1B. FIG. 1B is a graph 140 of the output power P 115 of generator 100 as a function of control signal C 135 in a situation in which P is unstable. Notice that graph 140 is not one-to-one (i.e., it is a relation but not a function). That is, there are multiple values of P for some values of C. With a control signal 135 of $C_1$ (145), P is initially at point 150, but P subsequently drops to point 155. Compensating for the drop in output power 115 by changing control signal 135 to $C_2$ (160) initially produces P at point 165, but P subsequently jumps up to point 170. The transition from point 150 to 155 or from point 165 to point 170 can occur in as little as 2-3 μs in some applications.

Figure 1C:
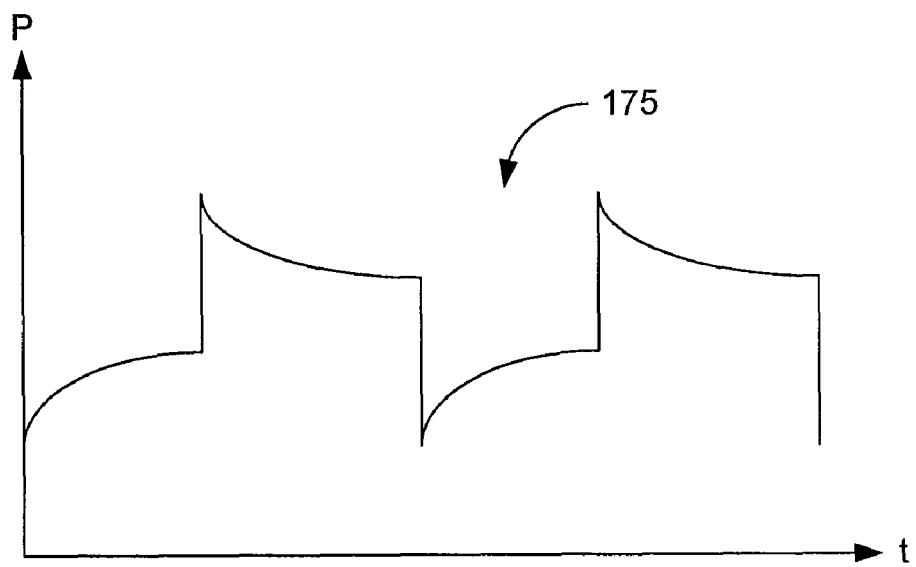
FIG. 1C is a graph of the output power P of the generator shown in FIG. 1A as a function of time in the same situation as in FIG. 1B.

The resulting output power 115 of generator 100 as a function of time is sketched as graph 175 in FIG. 1C.

Figure 2A:
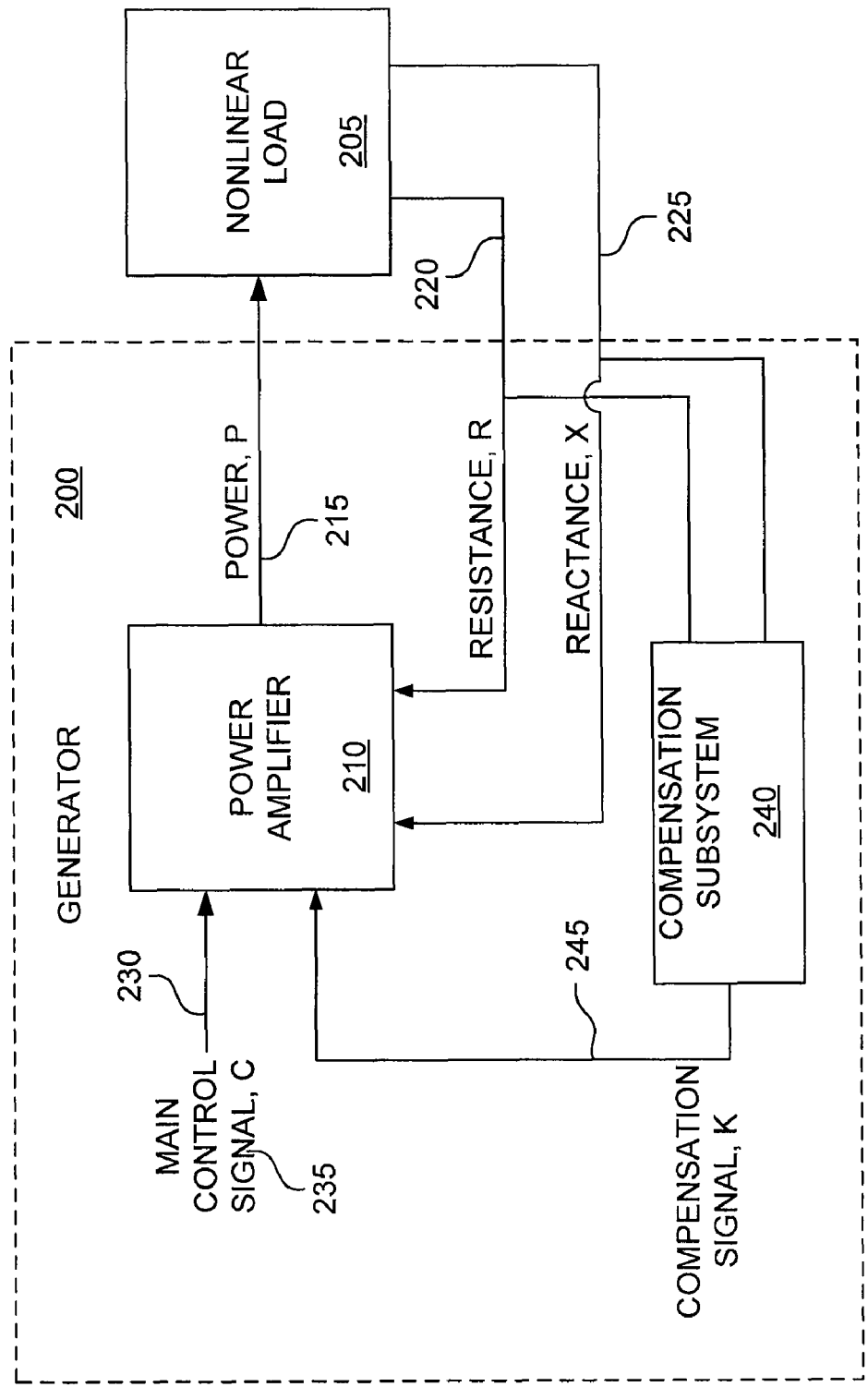
FIG. 2A is a block diagram of a generator connected with a nonlinear load in accordance with an illustrative embodiment of the invention.

Referring now to FIG. 2A, it is a block diagram of a generator 200 connected with a nonlinear load 205 in accordance with an illustrative embodiment of the invention. Generator 200 includes an "engine" of some kind. Examples of an "engine" include, without limitation, a power amplifier and a converter. In the particular embodiment illustrated in FIG. 2A, generator 200 includes a power amplifier 210, which delivers output power P 215 to nonlinear load 205. In one embodiment, generator 200 is a radio-frequency (RF) generator with a highly reactive source impedance, and nonlinear load 205 includes, among other things such as a matching network and cabling, a plasma. Such systems can be used in, for example, vapor deposition and etching applications. Nonlinear load 205 presents to power amplifier 210 a complex impedance Z with real and imaginary components resistance R 220 and reactance X 225, respectively (Z=R+jX).

Power amplifier 210 includes control input 230, to which main control signal C 235 is fed. For example, in one embodiment main control signal 235 is a voltage. In general, main control signal 235 is used to control the output power, output voltage, output current, or any combination thereof delivered by generator 200 to nonlinear load 205. Main control signal 235 is produced by a main power control loop (not shown in FIG. 2A). For example, in one typical implementation of a main power control loop, the fed-back power measured at the load and a power set point (desired output power 215) are fed to the inputs of a differential amplifier, the output of which (the error signal) is main control signal 235.

Compensation subsystem 240 measures the impedance of nonlinear load 205 and generates a compensation signal K 245 that corresponds to (depends on) the measured load impedance. Compensation signal 245, which is fed to power amplifier 210, renders the transfer function of the output power 215 of generator 200 with respect to main control signal 235 substantially insensitive to variations in the impedance of nonlinear load 205. The result is to stabilize the system by linearizing the output power 215 as a function of the main control signal 235. Compensation signal 245 for a given measured load impedance varies depending on the particular embodiment.

Figure 2B:
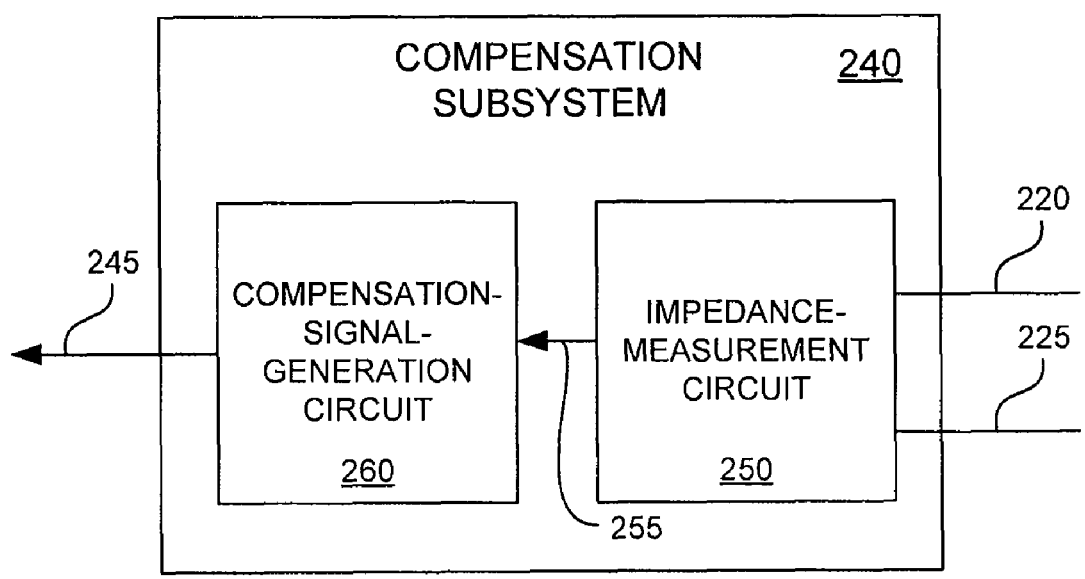
FIG. 2B is a block diagram of a compensation subsystem for a generator in accordance with an illustrative embodiment of the invention.

FIG. 2B is a block diagram of compensation subsystem 240 in accordance with an illustrative embodiment of the invention. Compensation subsystem 240 includes impedance-measurement circuit 250, which outputs measured load impedance 255, and compensation-signal-generation circuit 260, which generates compensation signal 245.

Compensation signal 245 can be determined in advance through a suitable calibration such as the following: First, generator 200 is connected with a test load having an adjustable impedance (e.g., a tuning circuit). The load is set initially to a nominal reference impedance with which generator 200 is designed to operate (e.g., 50 ohms). Second, a desired power set point $P_0$ is input to generator 200, and generator 200 is allowed to settle at output power $P_0$. Third, the main control signal 235 is frozen (fixed) at the current value that produces output power $P_0$ into the reference impedance. Fourth, the load impedance is varied, and the compensation signal 245 required to maintain an output power 215 of $P_0$ with that load impedance is recorded. The fourth step is then repeated for as many values of the load impedance as desired. The entire calibration procedure above is repeated for as many different output-power set points as desired.

In an illustrative embodiment, compensation subsystem 240 is implemented using high-speed digital algorithms in what may be termed by those skilled in the art as the "reflection-coefficient domain." In one embodiment, for example, compensation subsystem 240 is implemented along with other functions of generator 200 in a field-programmable gate array (FPGA). In other embodiments, compensation subsystem 240 is implemented using a processor that executes firmware or software. In general, the functionality of compensation subsystem 240 can be implemented in hardware, firmware, software, or a combination thereof.

In this illustrative embodiment, impedance-measurement circuit 250 is capable of measuring the impedance of nonlinear load 205 approximately once every microsecond, providing for the cancellation of frequencies associated with instability below approximately 500 kHz. This sampling rate is lower or higher in other embodiments.

In one embodiment, compensation-signal-generation circuit 260 includes a lookup table for each of a plurality of output power levels 215. Each lookup table for a given output power 215 maps each of a set of discrete values of the measured load impedance 255 to a corresponding discrete value of compensation signal 245. In such an embodiment, compensation-signal-generation circuit 260 includes a digital-to-analog (D/A) converter (not shown in FIG. 2B) to produce an analog compensation signal 245.

In some embodiments the calibration procedure for a given output power level is performed for only a few points (e.g., four load-impedance values other than the reference impedance that bracket the reference impedance on a Smith chart). For other values of the measured load impedance 255, the compensation signal K can be obtained from those few stored values by interpolation, for example. In some embodiments, slopes (gradients) of compensation signal 245 as a function of the measured load impedance 255 are stored in the lookup tables, and the compensation signal 245 for a specific measured load impedance 255 is interpolated by multiplying the appropriate slope by the difference between the measured load impedance 255 and the reference impedance. Also, in some embodiments, fast numerical algorithms such as successive approximation are used to perform mathematical operations such as division, improving the speed of compensation subsystem 240.

Figure 3:
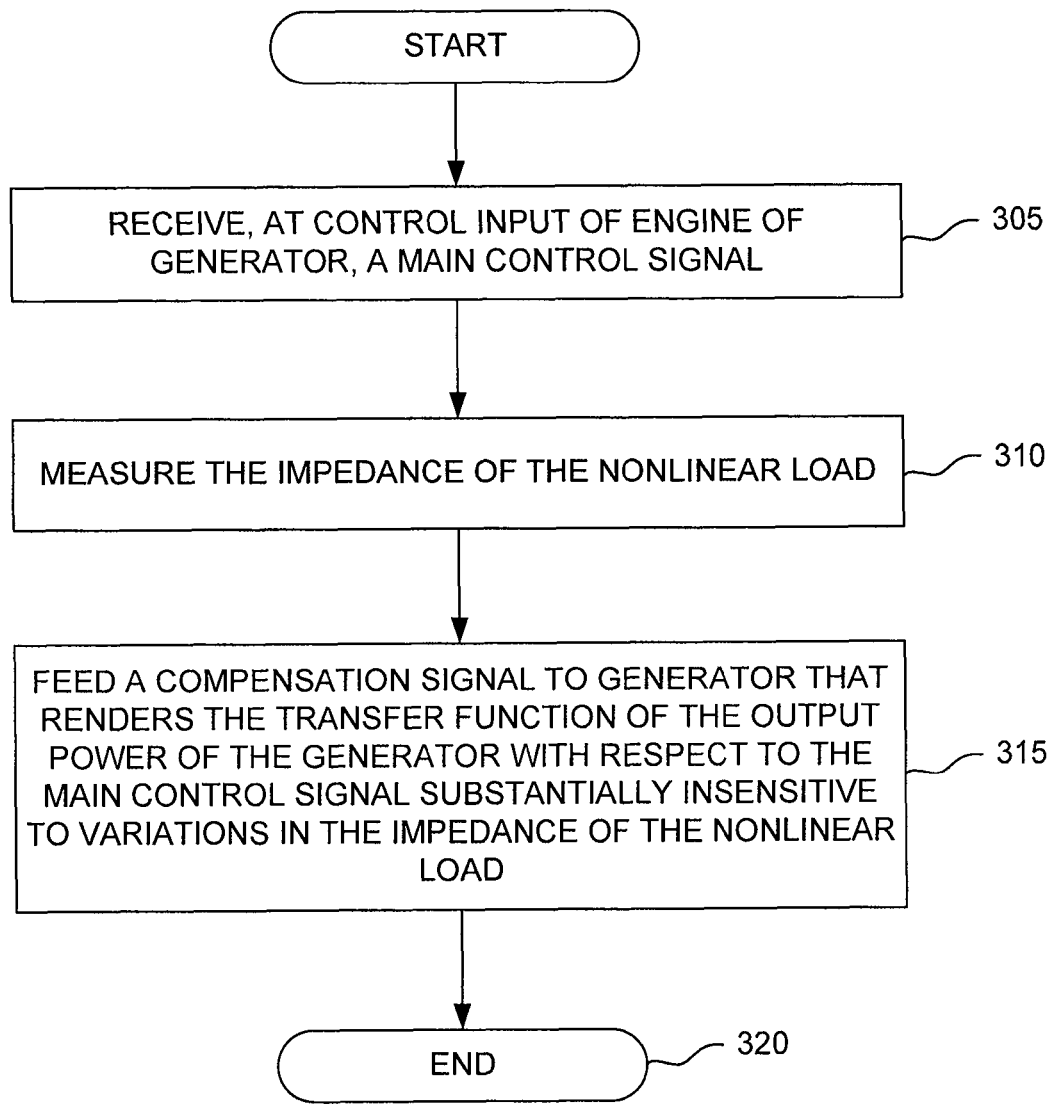
FIG. 3 is a flowchart of a method for modifying interactions between a generator and a nonlinear load in accordance with an illustrative embodiment of the invention.

FIG. 3 is a flowchart of a method for modifying interactions between a generator and a nonlinear load in accordance with an illustrative embodiment of the invention. At 305, power amplifier 210 receives at control input 230 a main control signal 235. At 310, impedance-measurement circuit 250 measures the impedance 255 of nonlinear load 205. At 315, compensation-signal-generation circuit 260 produces a compensation signal 245 that is fed to power amplifier 210. Compensation signal 245 renders the transfer function of the output power 215 of generator 200 with respect to main control signal 235 substantially insensitive to variations in the impedance of nonlinear load 205. Thus, compensation signal 245, in combination with main control signal 235, causes generator 200 to maintain a stable (substantially constant) output power 215 at a desired level $P_0$ despite variations in the impedance of nonlinear load 205. At 320, the process terminates.

Figure 4:
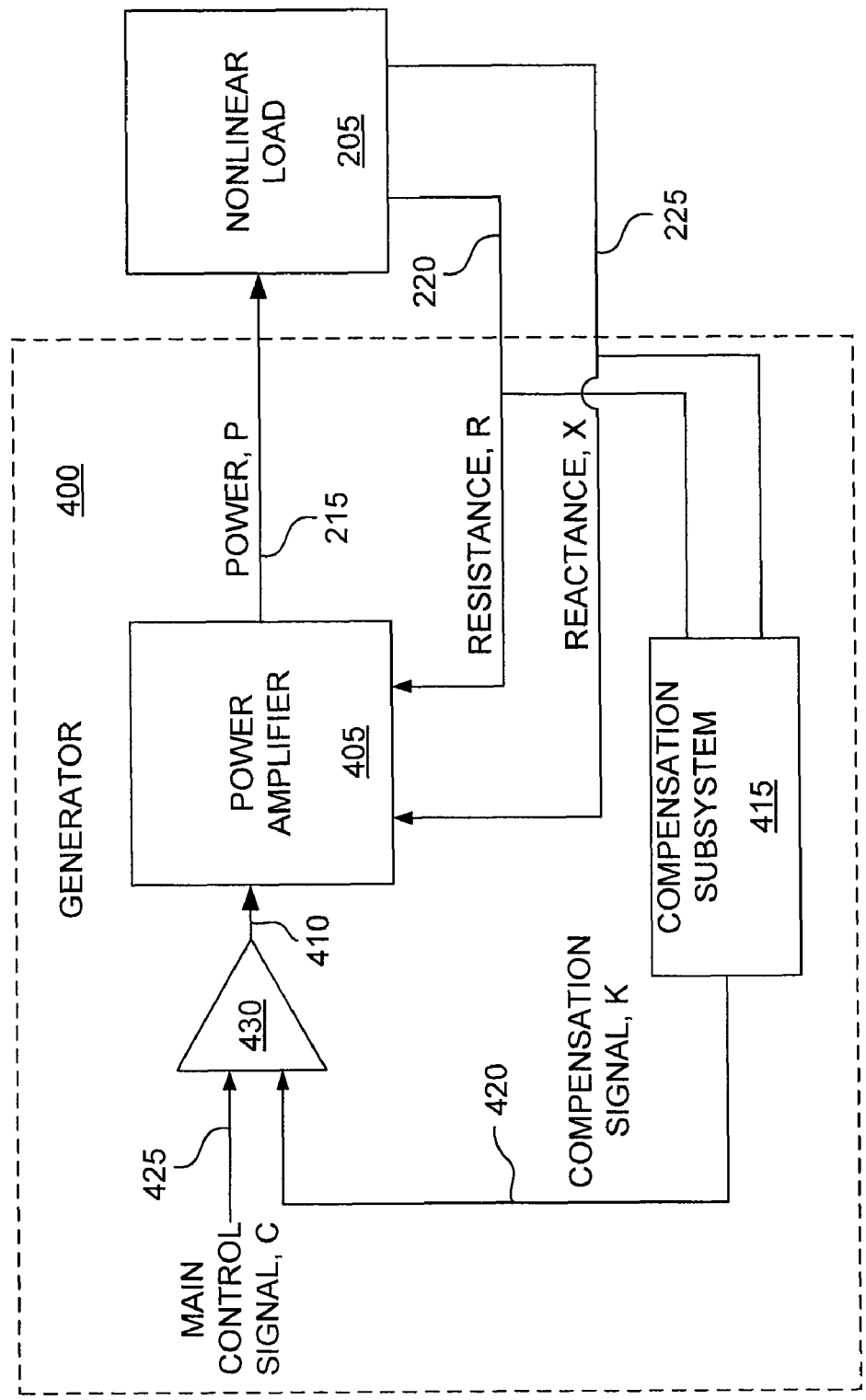
FIG. 4 is a block diagram of a generator connected with a nonlinear load in accordance with another illustrative embodiment of the invention.

FIG. 4 is a block diagram of a generator 400 connected with a nonlinear load 205 in accordance with another illustrative embodiment of the invention. Generator 400 includes power amplifier 405 with control input 410. Compensation subsystem 415 produces a compensation signal K 420 that is fed, along with main control signal 425, to summing circuit 430. The output of summing circuit 430 is fed to control input 410. As in the embodiment discussed above in connection with FIGS. 2A-3, compensation signal 420 has the effect of rendering the transfer function of the output power 215 of generator 400 with respect to main control signal 425 substantially insensitive to variations in the impedance of nonlinear load 205 to prevent instability of output power 215 that would otherwise result due to interactions between generator 400 and the impedance of nonlinear load 205.

Figure 5A:
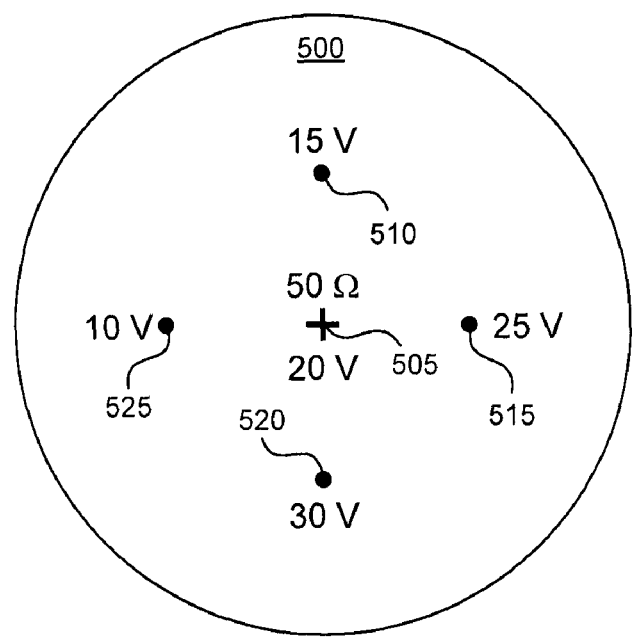
FIG. 5A is an illustration of a simplified Smith chart showing the required generator control signal C for each of a set of load impedances for a particular output power $P_0$ in accordance with an illustrative embodiment of the invention.

FIG. 5A is an illustration of a simplified Smith chart 500 showing the required power-amplifier control signal at control input 410 for each of a set of load impedances for a particular output power $P_0$ (215) in accordance with an illustrative embodiment of the invention. In the hypothetical example of FIG. 5A, the main control signal 425 required to produce a desired output-power level of 100 W ($P_0$) into 50 ohms (the reference impedance) is 20 V. The reference impedance corresponds to point 505 at the center of Smith chart 500. Points 510, 515, 520, and 525 correspond to measured load impedances 255 that differ from reference impedance 505. The control signal at control input 410 that would be required to produce the desired output power $P_0$ for each of these impedances is shown on simplified Smith Chart 500. These various values of the required control signal at control input 410 as a function of load impedance can be determined through a calibration procedure such as that described above and stored in a lookup table to which compensation-signal-generation circuit 260 has access.

Figure 5B:
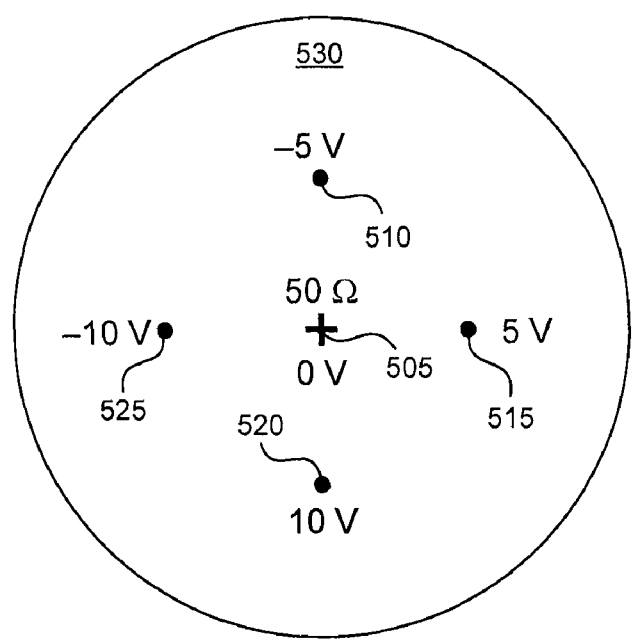
FIG. 5B is an illustration of a simplified Smith chart showing the compensation signal K for each of a set of load impedances for the same output power $P_0$ as in FIG. 5A in accordance with an illustrative embodiment of the invention.

FIG. 5B is an illustration of a simplified Smith Chart 530 showing the compensation signal K 420 corresponding to each of the set of load impedances (505, 510, 515, 520, and 525) plotted in FIG. 5A for the same desired output power $P_0$ in accordance with an illustrative embodiment of the invention. In this particular embodiment, compensation signal 420 is the difference between a control signal that would cause generator 400 to produce a particular output power 215 of $P_0$ when the impedance of nonlinear load 205 is the measured impedance and a control signal that would cause generator 400 to produce that same output power $P_0$ into the reference impedance. This difference is plotted for each of the points 505, 510, 515, 520, and 525 on simplified Smith Chart 530.

The sum produced by summing circuit 430—the sum of main control signal 425 and compensation signal 420—is thus the control signal at control input 410 that causes power amplifier 405 to produce the desired output power $P_0$ into the measured load impedance 255 for essentially the same main control signal value 425, irrespective of load impedance, thus rendering main control signal 425 insensitive to variations in the impedance of nonlinear load 205. Of course, when the measured load impedance 255 is the reference impedance (point 505 in FIG. 5B), the compensation signal 420 is zero.

Figure 6:
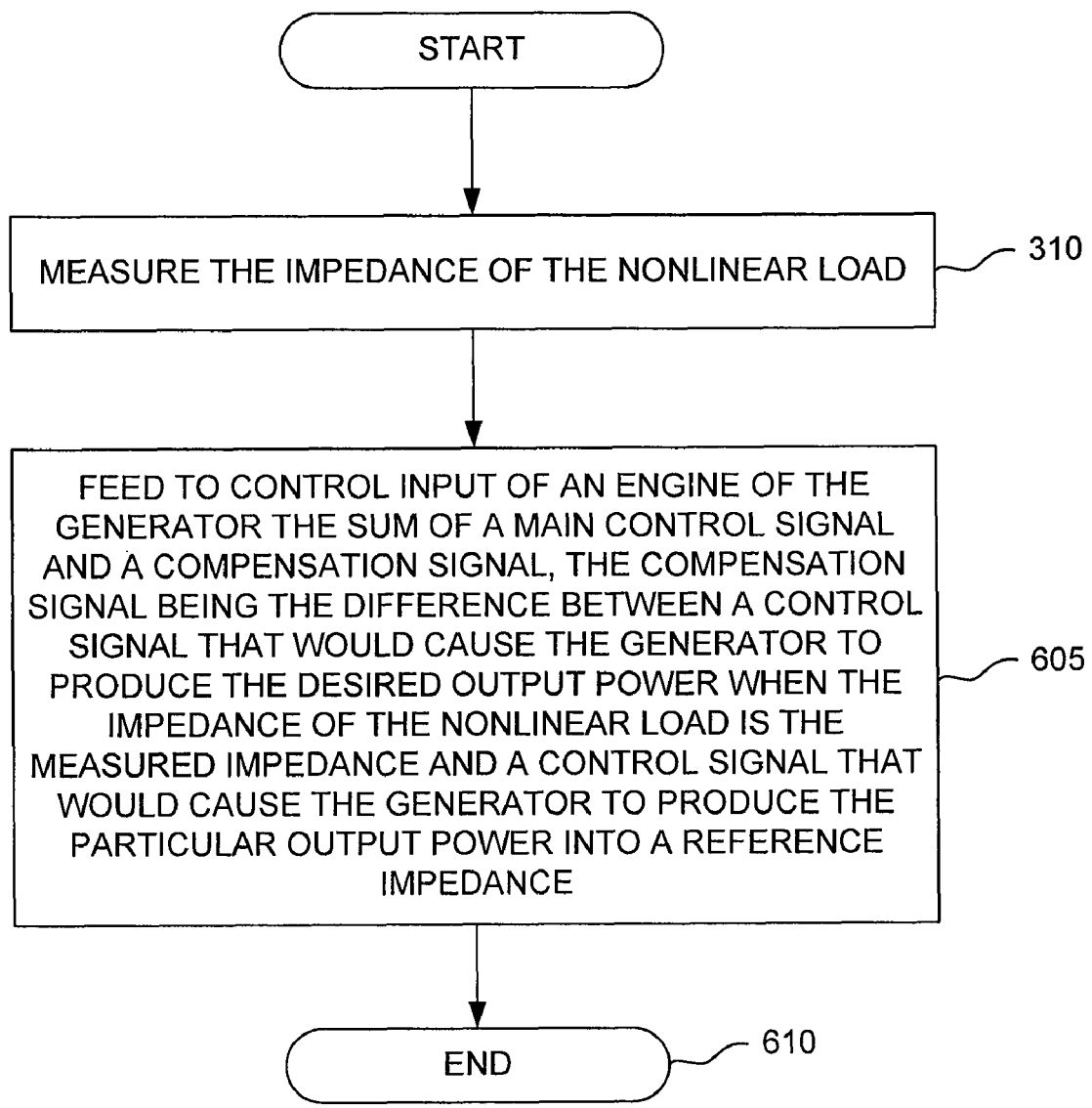
FIG. 6 is a flowchart of a method for modifying interactions between a generator and a nonlinear load in accordance with another illustrative embodiment of the invention.

FIG. 6 is a flowchart of a method for modifying interactions between a generator and a nonlinear load in accordance with another illustrative embodiment of the invention. At 310, impedance-measurement circuit 250 measures the impedance 255 of nonlinear load 205. At 605, the sum of main control signal 425 and compensation signal 420 is fed to control input 410 of power amplifier 405, the compensation signal 420 being the difference between a control signal that would cause generator 400 to produce a particular output power 215 of $P_0$ when the impedance of nonlinear load 205 is the measured impedance and a control signal that would cause generator 400 to produce that same output power $P_0$ into the reference impedance. The result is that instability of the output power 215 that would otherwise occur due to interactions between the generator 400 and the impedance of the nonlinear load 205 is prevented. The process terminates at 610.

Figure 7:
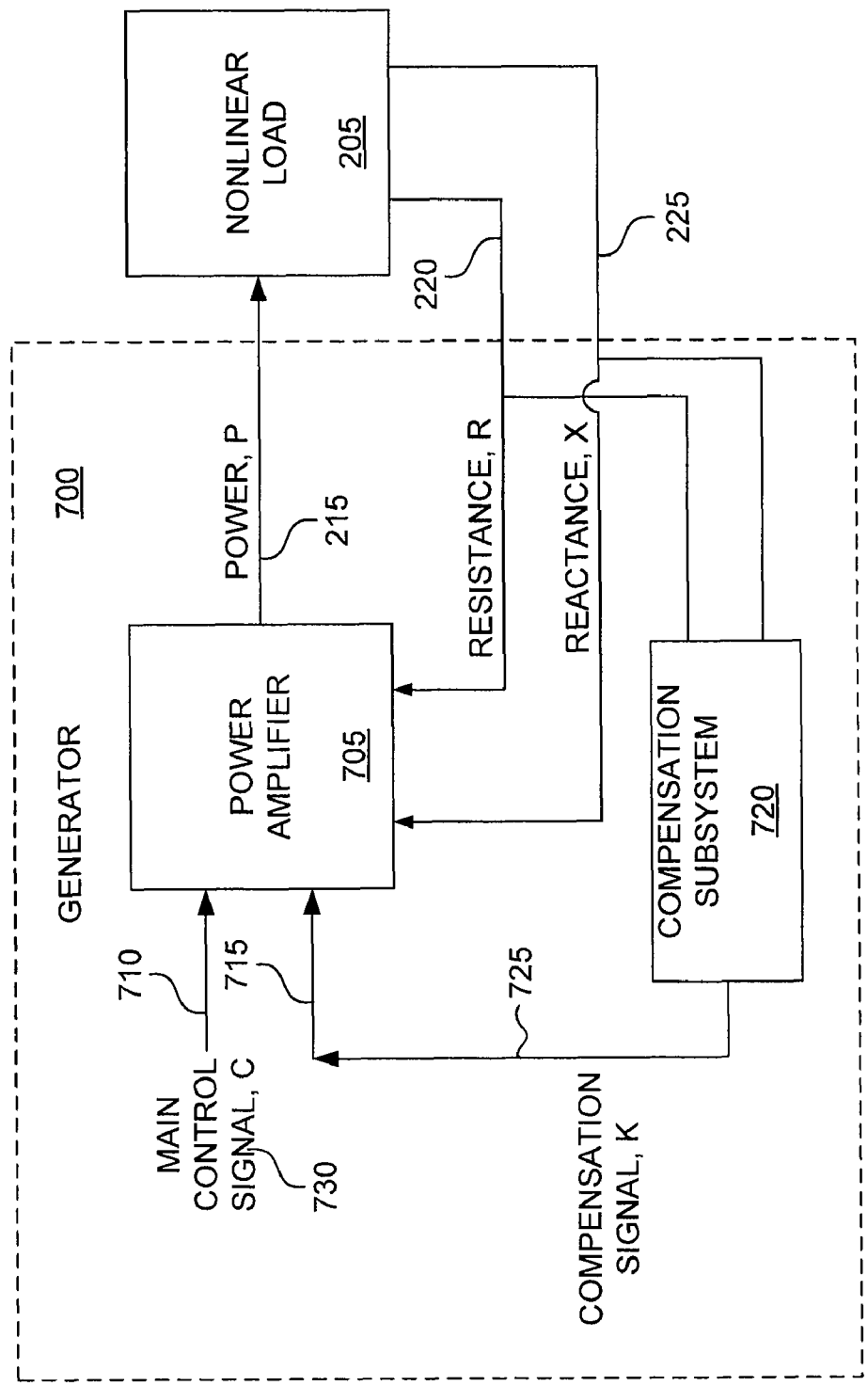
FIG. 7 is a block diagram of a generator connected with a nonlinear load in accordance with yet another illustrative embodiment of the invention.

FIG. 7 is a block diagram of a generator 700 connected with a nonlinear load 205 in accordance with yet another illustrative embodiment of the invention. In this embodiment, power amplifier 705 includes both a primary control input 710 and a secondary control input 715. Primary control input 710 receives a main control signal C 730.

Compensation subsystem 720 produces a compensation signal 725 specifically tailored for connection with secondary control input 715. Note that the specific compensation signal 725 as a function of load impedance depends on the design of power amplifier 705. Regardless of the design of power amplifier 705, however, a calibration procedure such as that described above can be performed to determine the compensation signal 725 for each of a set of values of the measured load impedance 255 for a given desired output power $P_0$.

The combination of main control signal 730 and compensation signal 725 causes power amplifier 705 to produce the desired output power $P_0$ in spite of variations of the impedance of nonlinear load 205. In other words, compensation signal 725 renders the transfer function of the output power 215 of generator 700 with respect to main control signal 730 substantially insensitive to variations in the impedance of nonlinear load 205, thereby stabilizing the output power 215 of generator 700 as a function of the main control signal 730.

Figure 8:
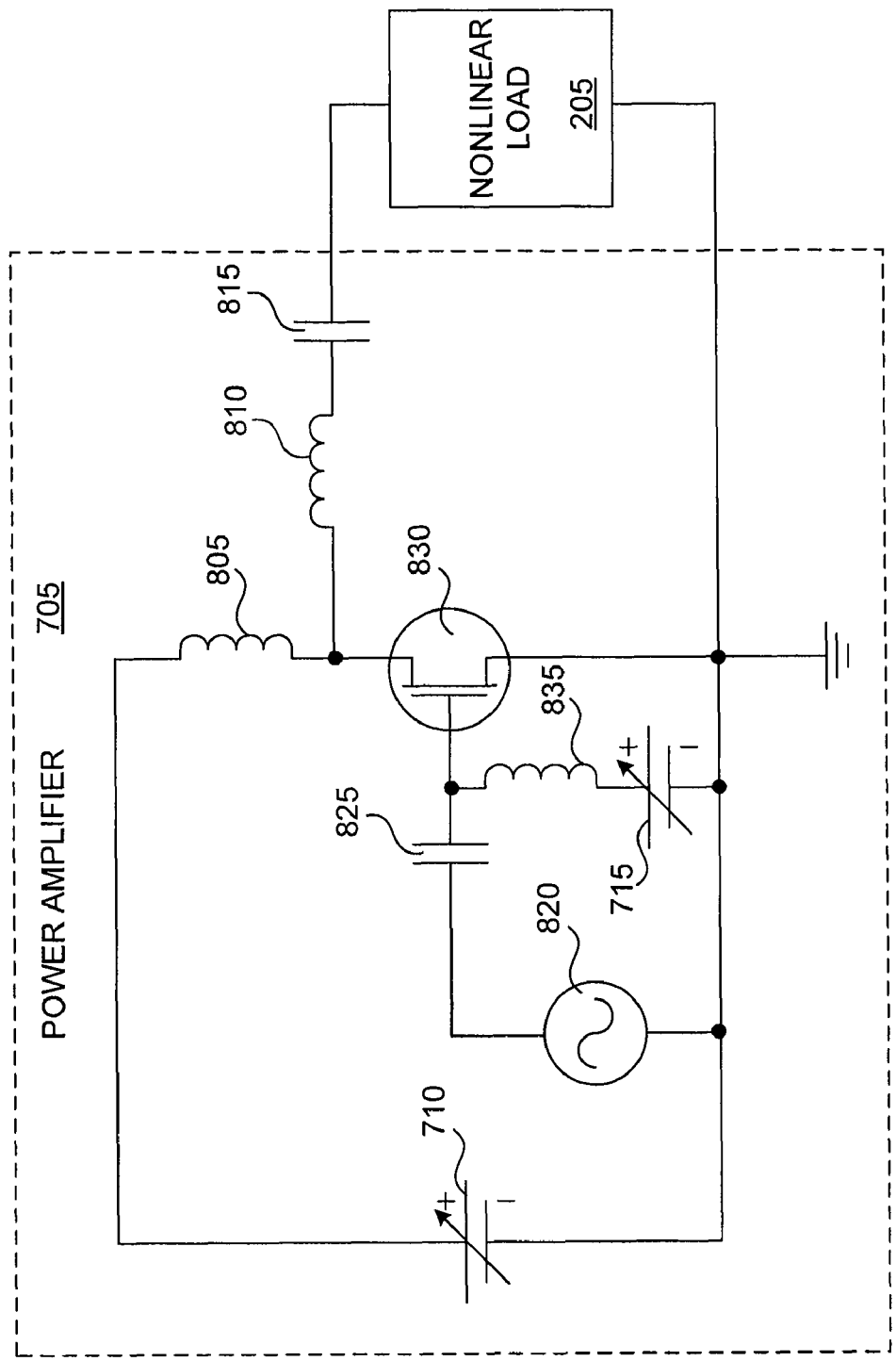
FIG. 8 is a circuit diagram of a power amplifier that includes both primary and secondary control inputs in accordance with an illustrative embodiment of the invention.

FIG. 8 is a circuit diagram of a power amplifier 705 that includes both primary and secondary control inputs 710 and 715, respectively, in accordance with an illustrative embodiment of the invention. In FIG. 8, primary control input 710 (a voltage in this example) is connected with choke 805. A resonant circuit including inductor 810 and capacitor 815 is connected between the opposite node of choke 805 and nonlinear load 205. Oscillator 820 is connected with capacitor 825, the opposite node of which is connected with the gate of metal-oxide-semiconductor field-effect transistor (MOSFET) 830. In this particular embodiment, secondary control input 715 is a bias voltage that is connected in series with choke 835, the opposite node of which is connected between a node of capacitor 825 and the gate of MOSFET 830. FIG. 8 is merely one example of a secondary control input 715. In other embodiments, secondary control input 715 differs from the bias-voltage example shown in FIG. 8.

Figure 9:
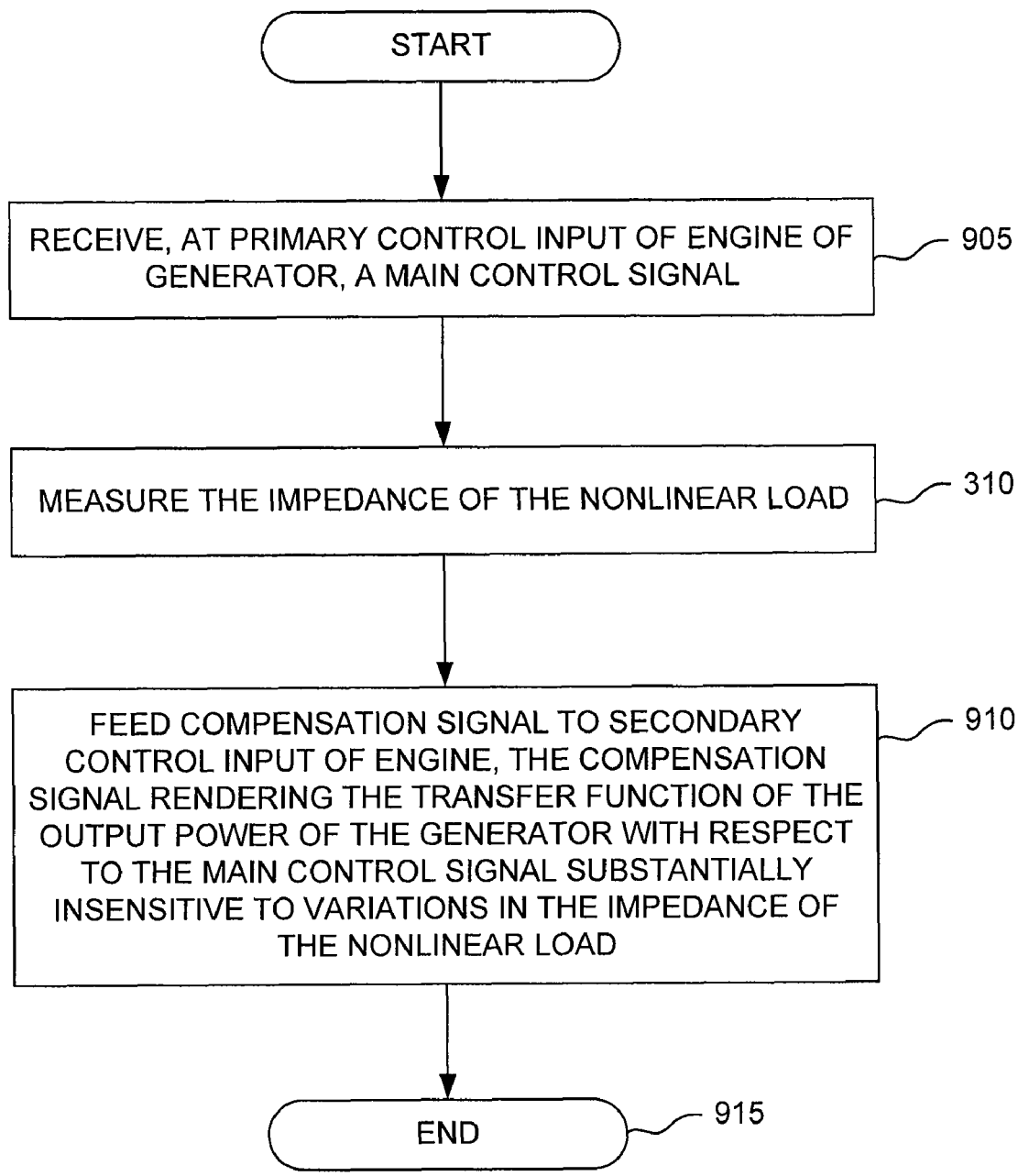
FIG. 9 is a flowchart of a method for modifying interactions between a generator and a nonlinear load in accordance with yet another illustrative embodiment of the invention.

FIG. 9 is a flowchart of a method for modifying interactions between a generator and a nonlinear load in accordance with yet another illustrative embodiment of the invention. At 905, power amplifier 705 receives, at its primary control input 710, a main control signal 730. At 310, impedance-measurement circuit 250 measures the impedance 255 of nonlinear load 205. At 910, compensation subsystem 720 feeds a compensation signal 725 to secondary input 715 of power amplifier 705, the compensation signal 725 rendering the transfer function of the output power 215 of generator 700 with respect to main control signal 730 substantially insensitive to variations in the impedance of nonlinear load 205, thereby preventing instability of the output power 215 that would otherwise result due to interactions between the generator 700 and the impedance of the nonlinear load 205. The process terminates at 915.

In some embodiments, the compensation signal effectively nulls the inner product in Equation 1 above. That is, the compensation signal nullifies the sensitivity of the power amplifier to changes in the impedance of the nonlinear load. In other embodiments, additional compensation can be applied to the power amplifier via the compensation signal to render the inner product in Equation 1 other than zero, causing the power amplifier and the impedance of the nonlinear load to interact in a particular desirable manner. In some embodiments, this additional compensation to achieve a desired interaction between the generator and the nonlinear load can be specified by a user of the generator. This additional compensation can provide, for example, additional stability beyond that provided by simply nullifying the sensitivity of the power amplifier to changes in the load impedance.

In conclusion, the present invention provides, among other things, a method and apparatus for modifying interactions between an electrical generator and a nonlinear load. Those skilled in the art can readily recognize that numerous variations and substitutions may be made in the invention, its use, and its configuration to achieve substantially the same results as achieved by the embodiments described herein. Accordingly, there is no intention to limit the invention to the disclosed exemplary forms. Many variations, modifications, and alternative constructions fall within the scope and spirit of the disclosed invention as expressed in the claims.

What is claimed is:

1. An electrical generator, comprising:
an engine including a control input configured to receive a main control signal, the main control signal controlling at least one of output power, output current, and output voltage delivered by the electrical generator to a nonlinear load connected with an output of the electrical generator, the engine being one of a power amplifier and a converter; and a compensation-signal-generation circuit that receives an indication of an impedance of the nonlinear load and feeds to the electrical generator a compensation signal corresponding to the indication of the impedance of the nonlinear load, the compensation signal rendering a transfer function of the output power of the electrical generator with respect to the main control signal less sensitive to variations in the impedance of the nonlinear load so as to improve stability of the output power of the electrical generator.

2. The electrical generator of claim 1, further comprising:

a summing circuit having at least first and second inputs and an output, the first input receiving the main control signal, the second input receiving the compensation signal, the output of the summing circuit being connected with the control input, the summing circuit producing at its output the sum of the main control signal and the compensation signal.

3. The electrical generator of claim 2, wherein the compensation signal is the difference between a control signal that would cause the electrical generator to produce a particular output power when the impedance of the nonlinear load is the measured impedance and a control signal that would cause the electrical generator to produce the particular output power into a reference impedance.

4. The electrical generator of claim 1, wherein the engine further includes a secondary control input separate from the control input, the secondary control input receiving the compensation signal.

5. The electrical generator of claim 4, wherein the secondary control input is a bias-voltage input.

6. The electrical generator of claim 1, wherein the compensation signal, in addition to rendering the transfer function of the output power of the electrical generator with respect to the main control signal substantially insensitive to variations in the impedance of the nonlinear load, causes the electrical generator to interact with the impedance of the nonlinear load in a manner specified by a user.

7. The electrical generator of claim 1, wherein the electrical generator is a radio-frequency generator.

8. The electrical generator of claim 1, wherein the nonlinear load includes a plasma.

9. The electrical generator of claim 1, wherein the compensation-signal-generation circuit includes, for each of a plurality of output-power levels, a lookup table mapping a set of discrete values of the measured impedance to a corresponding set of discrete values of the compensation signal.

10. The electrical generator of claim 1, wherein a source impedance of the electrical generator is substantially different from the complex conjugate of a reference load impedance.

11. The electrical generator of claim 10, wherein the reference load impedance is 50 ohms.

12. An electrical generator, comprising:

an engine including a control input;

a measurement system capable of measuring a quantity representative of a load impedance of a load connected to the generator and power delivered to the load;

a power control system, the power control system receiving a user power setpoint and an indication of the power delivered to the load from the measurement system, and in response, generating an internal power setpoint;

a compensation system, the compensation system receiving the internal power setpoint as well as an indication of the load impedance from the measured system, and in response, generating a control signal applied to the engine that generates load power equal to the internal power setpoint into a load with impedance equal to the measured load impedance under static conditions and is capable of generating the control signal with additional dynamic control under non-static conditions.

13. The electrical generator of claim 12, wherein the engine is one of a power amplifier and a converter.

14. The electrical generator of claim 12, wherein the measurement system is capable of measuring impedance or reflection coefficient.

15. The electrical generator of claim 12, wherein the compensation signal renders a transfer function of the output power of the electrical generator with respect to the main control signal substantially insensitive to variations in the impedance of the nonlinear load to stabilize the output power of the electrical generator.

16. An electrical generator, comprising:

an amplifier configured to apply output power to a nonlinear load, the amplifier including a switching component;

means for controlling, responsive to a main control signal, a level of the output power that is applied by the power amplifier; and means for applying, responsive to variations in an impedance of the nonlinear load, a potential to the switching component so as to reduce a sensitivity of the amplifier to the variations in the impedance of the nonlinear load.

17. The electrical generator of claim 16, wherein the switching component includes a metal-oxide-semiconductor field effect transistor (MOSFET) and the means for applying the potential includes means for applying a variable potential to a gate of the MOSFET responsive to the variations in the impedance of the nonlinear load.

* * * * *